United States Patent [19]

Granger-Jones et al.

[11] Patent Number: 5,760,641
[45] Date of Patent: Jun. 2, 1998

[54] CONTROLLABLE FILTER ARRANGEMENT

[75] Inventors: Marcus Richard Granger-Jones; Colin Leslie Perry, both of Swindon, United Kingdom

[73] Assignee: Plessey Semiconductors Limited, United Kingdom

[21] Appl. No.: 604,494

[22] Filed: Feb. 21, 1996

[30]  Foreign Application Priority Data

Mar. 15, 1995 [GB] United Kingdom ............... 9505250

[51] Int. Cl.$^6$ ............................................................. H03K 5/00
[52] U.S. Cl. ........................... 327/553; 327/552; 333/172; 330/305
[58] Field of Search ............................. 327/311, 552, 327/553, 555, 556, 557, 558, 559, 560, 561, 344; 330/305, 306; 333/173, 172

[56]  References Cited

U.S. PATENT DOCUMENTS

| | | | |
|---|---|---|---|
| 4,306,198 | 12/1981 | Okada | 330/26 |
| 5,053,650 | 10/1991 | Ohkubo et al. | 327/553 |
| 5,418,483 | 5/1995 | Hiroshi | 327/553 |

FOREIGN PATENT DOCUMENTS

| | | |
|---|---|---|
| 0 264 161 A2 | 4/1988 | European Pat. Off. |
| WO 87/06406 | 10/1987 | WIPO . |
| WO 95/06977 | 3/1995 | WIPO . |

OTHER PUBLICATIONS

"Differentiate and Dump Receiver Circuitry", IBM Technical Disclosure Bulletin, vol. 29, No. 8, p. 3555–3557, Jan. 1987.

*Primary Examiner*—Timothy P. Callahan
*Assistant Examiner*—Dinh Le
*Attorney, Agent, or Firm*—Kirschstein et al.

[57]  ABSTRACT

A controllable filter arrangement comprises a filter network for filtering an input signal of the filter arrangement, and a transistor, the transistor being configured as a voltage-follower having a controllable current source in its output circuit for providing a controllable DC transistor output current, an output terminal of the voltage-follower being connected to the filter network such that a cut-off frequency of the filter can be controlled by variation of the DC current supplied by the current source. The filter network may be a single-pole RC network and the output of the follower may be connected to an additional capacitor (or resistor) of the network which is coupled to the junction of the existing capacitor and resistor. The effect of the filter arrangement is to create a filter which is controllable between two values of cut-off frequency, depending on whether the additional capacitor (or resistor) is effectively driven or not by the voltage-follower, or which is continuously controllable over a range of cut-off frequencies, depending on the value of the current provided by the current source.

5 Claims, 5 Drawing Sheets

CONTROLLABLE FILTER ARRANGEMENT

BACKGROUND OF THE INVENTION

The invention concerns a controllable filter arrangement comprising a filter network for filtering an input signal, and especially, but not exclusively, a filter arrangement for electronically controlling the cut-off frequency of a passive filter, especially a high-pass filter.

Filters, in the form of simple passive high-pass filters, are commonly used to couple successive stages in a circuit. Limiting amplifiers, for example, at audio and IF frequency typically have gains in excess of 70 dB. In such circuits, if no high-pass filters are present in the form of capacitive coupling, small DC offsets in one stage are amplified in succeeding stages and this may cause these later stages to go into saturation, thereby losing their small-signal gain.

This loss of small-signal gain can be obviated by including first-order high-pass filters after every approximately 30 dB of gain down the IF amplifier. This eliminates any DC offsets before they become amplified sufficiently to cause saturation of later stages. Two schemes for high-pass (AC) coupling are shown in FIGS. 1a and 1b. In FIG. 1a a high-pass coupling arrangement comprises a filter network 10 consisting of a capacitor 11 and a series-connected resistor 12 and a buffer amplifier 15. The network 10 is driven by a signal source 13 through a source impedance 14. FIG. 1b shows the same scheme, but with the capacitor 11 coupled to a signal-ground reference level 16 instead of to an input signal from the generator 13. Both circuits function in exactly the same way, allowing only the relatively high-frequency components of the input signal to be passed through to the output 18.

Another application of the high-pass filter is as a defining agent of the noise bandwidth of a system. FIG. 2 shows a block diagram of a direct-conversion radio receiver in which high-pass filters 21 operate along with low pass filters 22 to define the noise bandwidth of the receiver.

A problem with the existing AC-coupling techniques, where they are implemented on integrated circuits (IC's), is that the high-pass cut-off frequencies cannot be tuned electronically, e.g. by the application of a control voltage or current to pin on the IC. This has the disadvantage, firstly, that wide variations existing between component values on an IC cannot be compensated for by a simple tuning process, and secondly, that the high-pass filter characteristic cannot be electronically tuned to optimise a system's noise bandwidth for a particular incoming modulated signal. In the first case, it is desired to maintain a constant cut-off frequency despite tolerances in component values; in the second case, it is desired deliberately to change the cut-off frequency to suit varying conditions. As regards this second case, it would be desirable to be able to electronically tune the high-pass characteristic in order to optimise the pre-detection noise bandwidth for a receiver which is detecting an FSK-modulated signal with a peak deviation of either 4 kHz or 6.5 kHz. Existing methods would require two separate filter realisations tailored to these two different frequencies.

SUMMARY OF THE INVENTION

It is an aim of the present invention to provide a filter arrangement which overcomes or mitigates the drawbacks associated with the known IC filter arrangements.

In accordance with the invention there is provided a controllable filter arrangement comprising a filter network for filtering an input signal of the filter arrangement, and a first transistor, the first transistor being configured as a first voltage-follower having a controllable current source in its output circuit for providing a controllable DC transistor output current, an output terminal of the first voltage-follower being connected to the filter network such that a cut-off frequency of the filter can be controlled by variation of the DC current supplied by the current source.

The filter network may comprise a first input terminal, an output terminal and a first signal-ground terminal, an input terminal of the first voltage-follower being arranged to receive said input signal, and the output terminal of the voltage-follower being connected to said first filter-network input terminal.

The filter network may comprise an input terminal, an output terminal and a first signal-ground terminal, an input terminal of the voltage-follower being arranged to receive a DC reference voltage, the output terminal of the first voltage-follower being connected to said first filter-network signal-ground terminal and said filter-network input terminal being arranged to receive said input signal.

The filter network may comprise a plurality of passive components and a second input terminal, said first and second filter-network input terminals being connected to respective like first and second passive components at one end thereof, said like first and second passive components being connected at their other end to each other and to one or more other components of the plurality of passive components, said second filter-network input terminal being arranged to receive a signal corresponding to the input signal of the filter arrangement.

A second transistor may be provided configured as a second voltage-follower and having a current source in the output circuit thereof, the second voltage-follower having an input terminal connected to the input terminal of the first transistor and an output terminal connected to the second input terminal of the filter network.

The filter network may comprise one or more further input terminals and one or more corresponding further transistors may be provided configured as further voltage-followers, each further voltage-follower having a controllable current source in the output circuit thereof, said further filter-network input terminals being connected to respective further like passive components at one end thereof, the further like passive components being of the same type as the first and second like passive components and being connected at their other end to each other and to said other ends of said first and second like passive components, the one or more further voltage-followers having respective input terminals connected to the input terminal of the first voltage-follower and respective output terminals connected to respective further filter-network input terminals.

The filter network may comprise a plurality of passive components and a second signal-ground terminal, said first and second filter-network signal-ground terminals being connected to respective like first and second passive components at one end thereof, said like first and second passive components being connected at their other end to each other and to one or more other components of the plurality of passive components, said second filter-network signal-ground terminal being arranged to receive a DC reference voltage.

A second transistor may be provided configured as a second voltage-follower and having a current source in the output circuit thereof, the second voltage-follower having an input terminal connected to a DC reference voltage and an output terminal connected to the second filter-network signal-ground terminal.

3

The filter network may comprise one or more further signal-ground terminals and one or more corresponding further transistors may be provided configured as further voltage-followers, each further voltage-follower having a controllable current source in the output circuit thereof, said further filter-network signal-ground terminals being connected to respective further like passive components at one end thereof, the further like passive components being of the same type as the first and second like passive components and being connected at their other end to each other and to said other ends of said first and second like passive components, the one or more further voltage-followers having respective input terminals connected to the input terminal of the first voltage-follower, and respective output terminals connected to respective further filter-network signal-ground terminals.

Each of the controllable current sources may be controlled such as to provide either of two discrete values of output current, and the transistors may be bipolar, JFET or MOS-FET transistors.

The controllable current source may be controlled to provide substantially a continuity of values of output current, and the transistors may be bipolar transistors. Bipolars are preferred in this mode of control since they manifest a well-defined inverse relationship between emitter resistance ($r_e$) and DC operating current.

The filter network may be a series RC network.

BRIEF DESCRIPTION OF THE DRAWINGS

Various embodiments of the invention will now be described, by way of example only, with the aid of the drawings, of which.

DETAILED DESCRIPTION OF THE PREFERRED EMBODIMENTS

Figure 1A:
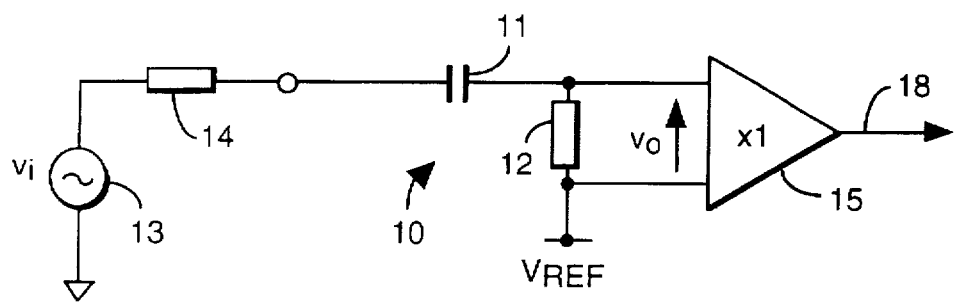
FIGS. 1a and 1b are circuit diagrams of two AC coupling arrangements.
Figure 1B:
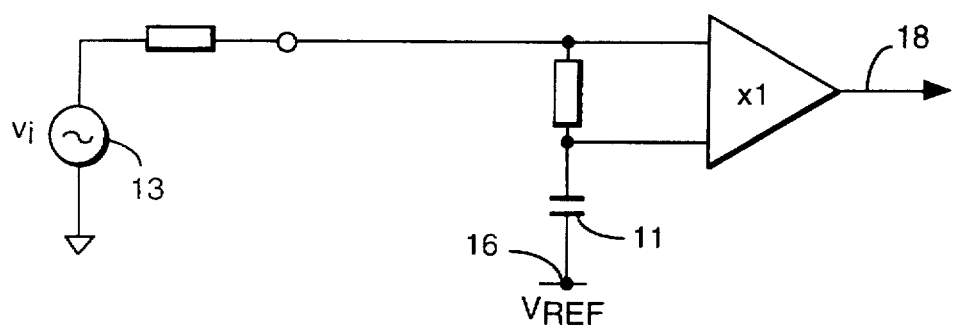
Figure 2:
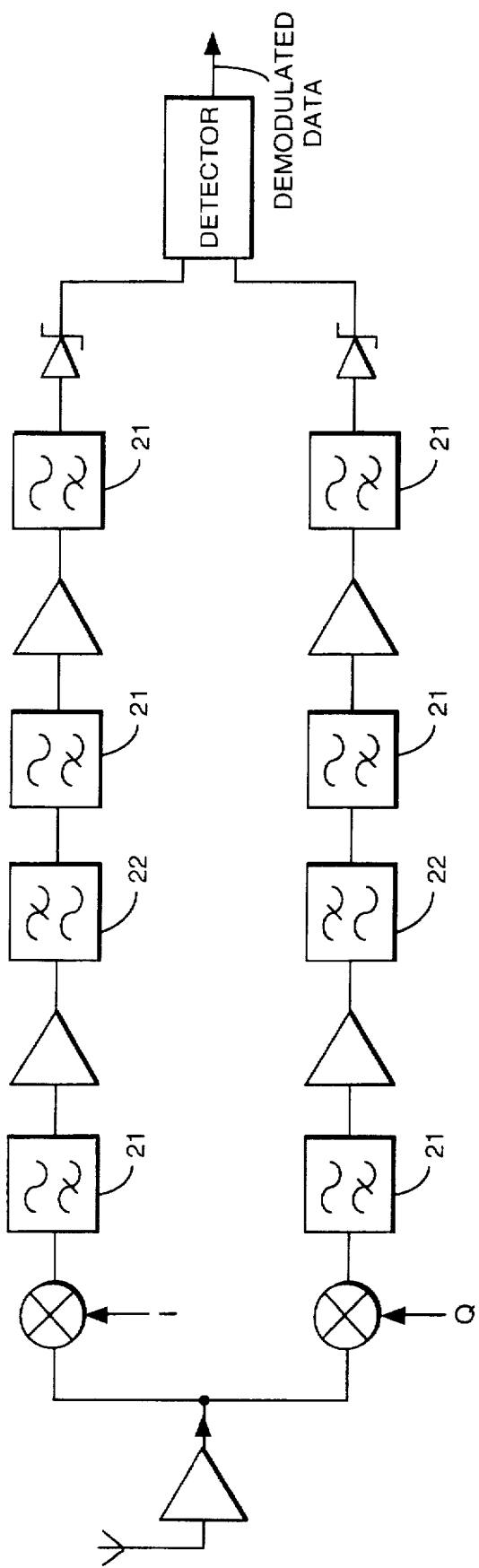
FIG. 2 is a schematic diagram of a direct-conversion radio receiver incorporating high-pass and low-pass filters.
Figure 3:
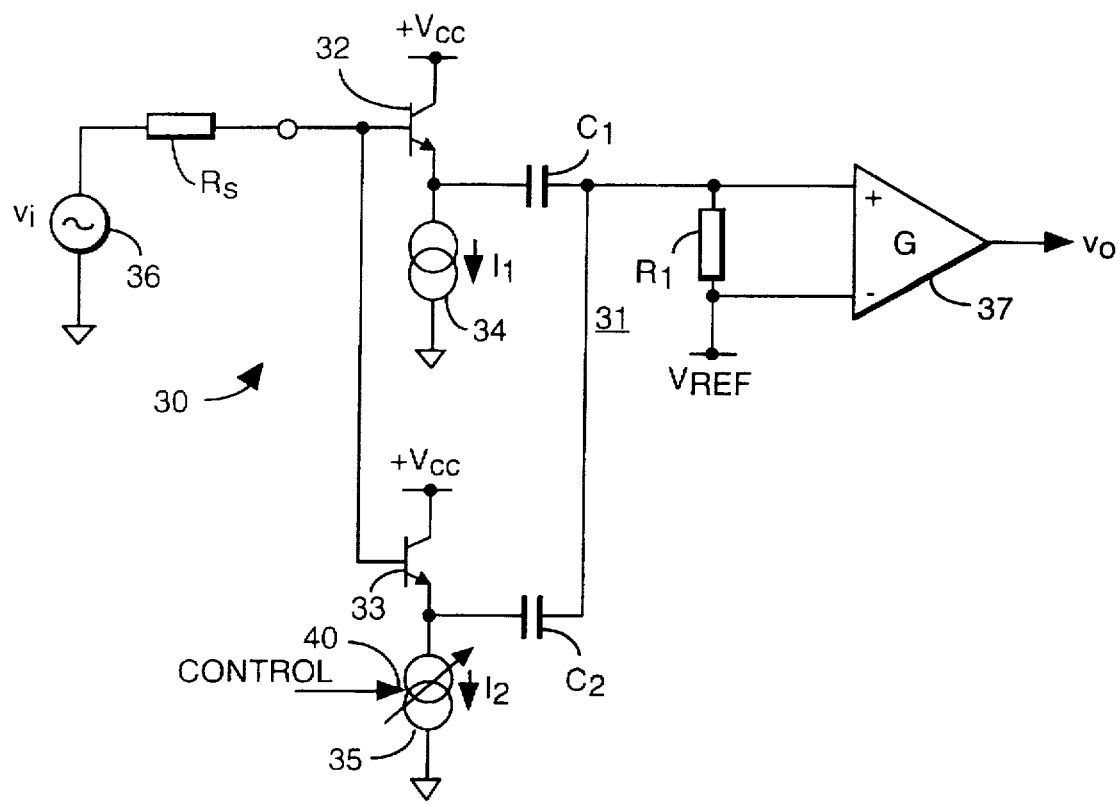
FIG. 3 is a circuit diagram of a first embodiment of the controllable filter arrangement according to the invention.

Referring now to FIG. 3, a filter arrangement 30 comprises a filter network 31 consisting of two capacitors $C_1$ and $C_2$ and a resistor $R_1$. The capacitors $C_1$ and $C_2$ are connected at one end to each other and to the resistor $R_1$ and at the other end to the emitters of respective emitter-follower transistors 32, 33. Also connected to the emitters are the current sources 34, 35, one of which (35) is variable. (The current sources 34, 35 act, in fact, as current sinks in the conventional terminology, due to the NPN configuration of the followers, however they will continue to be referred to as current "sources" since this is the commonly used generic term. Where PNP transistors were used, the "current sources" would indeed by "sources", as such). The bases of the emitter-followers 32, 33 are driven in common from an input signal source 36 having a source impedance $R_s$ providing an input signal $v_i$. The output voltage of the filter network 31 appearing across $R_1$ is amplified in an amplifier stage 37 with a gain G.

4

Figure 4:
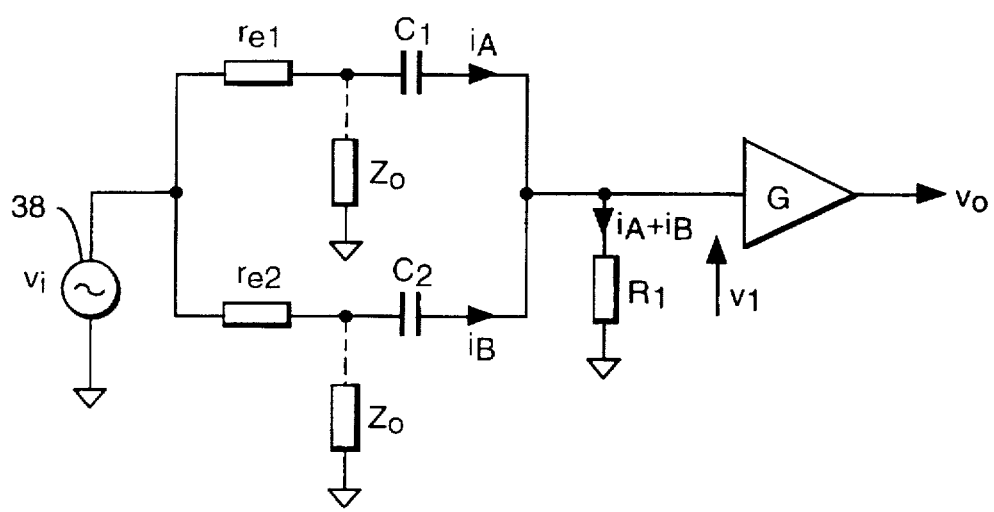
FIG. 4 is an equivalent circuit of the arrangement of FIG. 3.

FIG. 4 shows an equivalent circuit of the filter arrangement of FIG. 3, in which the input voltage $v_i$ is assumed to appear on the emitters of the transistors 32, 33 as a generator 38. The generator 38 drives the capacitors $C_1$, $C_2$ through the small-signal output resistance $r_{e1}$, $r_{e2}$ of the respective transistors. Shunting the output of each $r_e$ is the output impedance $Z_o$ of the current source 34, 35 associated with the respective transistor; this impedance is assumed to be high enough to be negligible.

The source impedance $R_s$ appears at the emitter of the respective transistor 32, 33 in series with $r_e$ and has a resistance of value $R_s/\beta$, where $\beta$ is the current gain of the transistor. This transformed source resistance can also be ignored if $R_s/\beta \ll R_1$. (Note that, for the sake of simplicity, the above term $R_s1\ominus$ assumes a perfect transistor with a constant current gain. In practice, $\beta$ will vary with frequency, such that at high frequencies the source-current term may no longer be negligible).

Using the Superposition Theorem on the currents $i_A$ and $i_B$, the following expression is derived for the transfer function $v_o/v_i$ of the filter arrangement:

$$\frac{v_o}{v_i} = G \frac{s(C_1 + C_2)R_1 \left[ 1 + s\frac{C_1 C_2}{C_1 + C_2}(r_{e_1} + r_{e_2}) \right]}{1 + s[C_1(R_1 + r_{e_1}) + C_2(R_1 + r_{e_2})] + s^2 C_1 C_2 [R_1(r_{e_1} + r_{e_2}) + r_{e_1} r_{e_2}]}$$

This is, in fact, a second-order equation, but if it assumed that $R_1 \gg r_{e1}$, $r_{e2}$, there arises the following first-order simplification:

$$\frac{v_o}{v_i} = G \cdot \frac{s(C_1 + C_2)R_1}{1 + s(C_1 + C_2)R_1}$$

which is none other than a standard RC high-pass filter in which C consists of $C_1$ and $C_2$ in parallel.

What has been obtained, therefore, is effectively a single-pole high-pass RC filter in which the capacitance C can be varied by variation of the current source 35. Varying the current sunk by the current source 35 varies the emitter resistance $r_e$ of the emitter-follower 33 in an inverse relation, such that as the current rises $r_e$ falls, thereby decreasing the total resistance in the RC network and increasing the cut-off frequency of the filter.

The current source is arranged to be controlled in a binary fashion, in which a control voltage on its control input 40 takes one of two possible values: a first value corresponding to a finite value of current, such that $C_2$ plays a significant role in determining the cut-off frequency of the filter network 31, or a second value corresponding to a value of current of substantially zero, such that $C_2$ is effectively excluded from the circuit.

In the first case, the finite current value is influenced by the above-mentioned inequality existing between $R_1$ and $r_e$, which requires that the current $I_2$ sunk by the current source 35 have a minimum value set by the relationship:

$$I_2 > \frac{V_T}{R_1}$$

where

-continued
$$V_T = \frac{kT}{q}$$

in which q is the charge on an electron, k is Boltzmann's constant and T is temperature in degrees Kelvin.

In the second of the two binary states, $I_2$ is allowed to go to zero, or to a very low level, by the application of a suitable control voltage on the control input 40 of the current source 35; $r_{e2}$ then rises towards infinity, the effect of which can be seen by recasting the transfer function of the filter arrangement as follows:

$$\frac{V_o}{V_i} = G \frac{s(C_1 + C_2)R_1 \left[ \frac{1}{r_{e_2}} + s \frac{C_1 C_2}{C_1 + C_2} \left( 1 + \frac{r_{e_1}}{r_{e_2}} \right) \right]}{\frac{1}{r_{e_2}} + s \left[ C_1 \frac{R_1 + r_{e_1}}{r_{e_2}} + C_2 \left( 1 + \frac{R_1}{r_{e_2}} \right) \right] + s^2 C_1 C_2 \left[ R_1 \left( 1 + \frac{r_{e_1}}{r_{e_2}} \right) + r_{e_1} \right]}$$

and for $r_{e2} \to \infty$:

$$\frac{V_o}{V_i} = G \frac{sC_1 R_1}{1 + sC_1(R_1 + r_{e_1})}$$

$$\approx G \frac{sC_1 R_1}{1 + sC_1 R_1}$$

This corresponds, as might be expected, to the situation where $C_2$ and $I_2$ are not present, the filter being formed solely from $R_1$ and $C_1$. In this binary control state, the filter has the higher of its two possible cut-off frequencies, since the filter capacitance is at its minimum value.

In a second embodiment of the filter arrangement according to the invention (see FIG. 5), a number of emitter-follower stages are employed driven in parallel from the common input signal $v_i$, their outputs (emitters) feeding respective capacitors $C_2 \ldots C_N$. These emitter followers have their own respective current sources which supply a current $I_2, I_3 \ldots I_N$. The control terminals 40 of these current sources are driven by a digital control word, one bit per control input, the effect being that capacitors $C_2 \ldots C_N$ are switched in or out at will to provide the requisite number of possible cut-off frequencies from the same basic filter arrangement.

Figure 6:
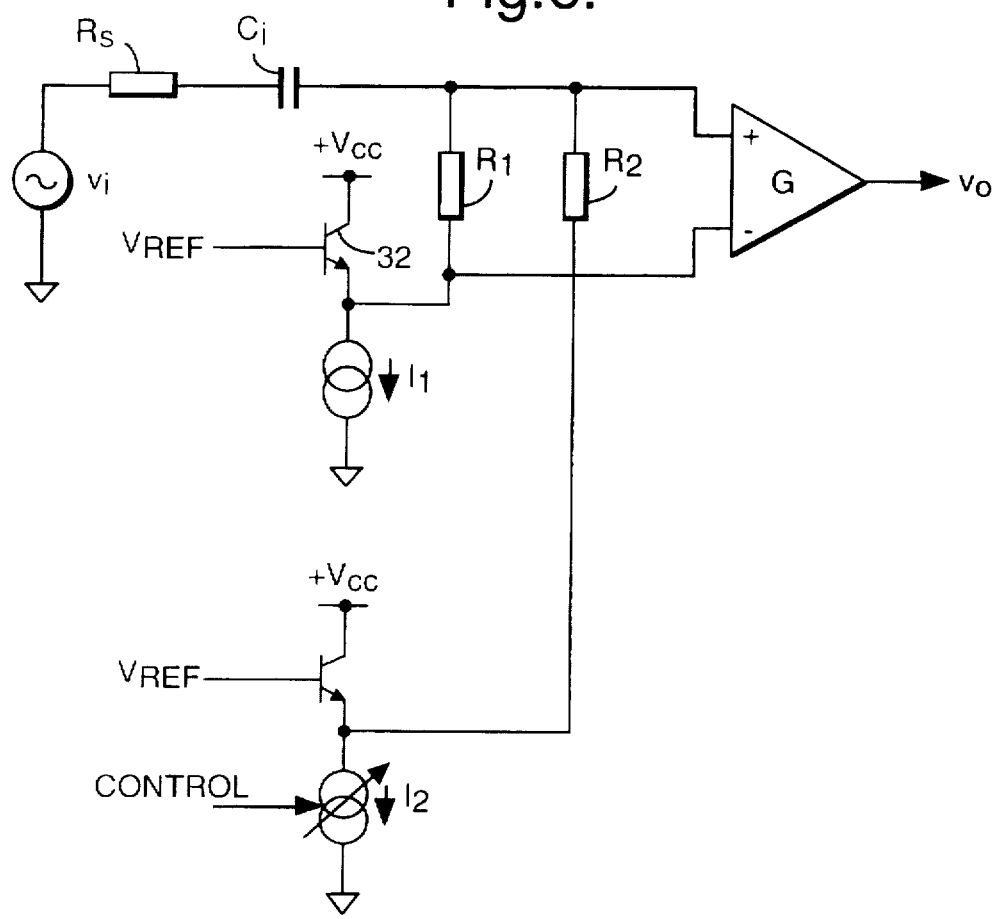
FIG. 6 is a circuit diagram of a third embodiment of the controllable filter arrangement according to the invention.

In a third embodiment of the invention, shown in FIG. 6, the emitter-followers are arranged to drive not the capacitive element in the RC filter network, but the resistive element. In this circuit, there is only one capacitor, $C_1$, but there are two resistors $R_1$, $R_2$. The two resistors $R_1$, $R_2$ are connected at one end to each other and to the capacitor $C_1$. The other end of capacitor $C_1$ is fed directly from the input signal $v_i$. The other end of $R_1$ is connected to the emitter of transistor 32, while the corresponding end of $R_2$ is connected to the emitter of transistor 33. The amplifier 37 is fed from directly across $R_1$. Although $R_1$ and $R_2$ are not connected directly in parallel, because the bases of the transistors 32, 33 are both connected to a reference voltage $V_{REF}$ the lower ends of $R_1$ and $R_2$ are referred to the same voltage level and signal ground, thereby ensuring the proper functioning of this particular arrangement.

Figure 5:
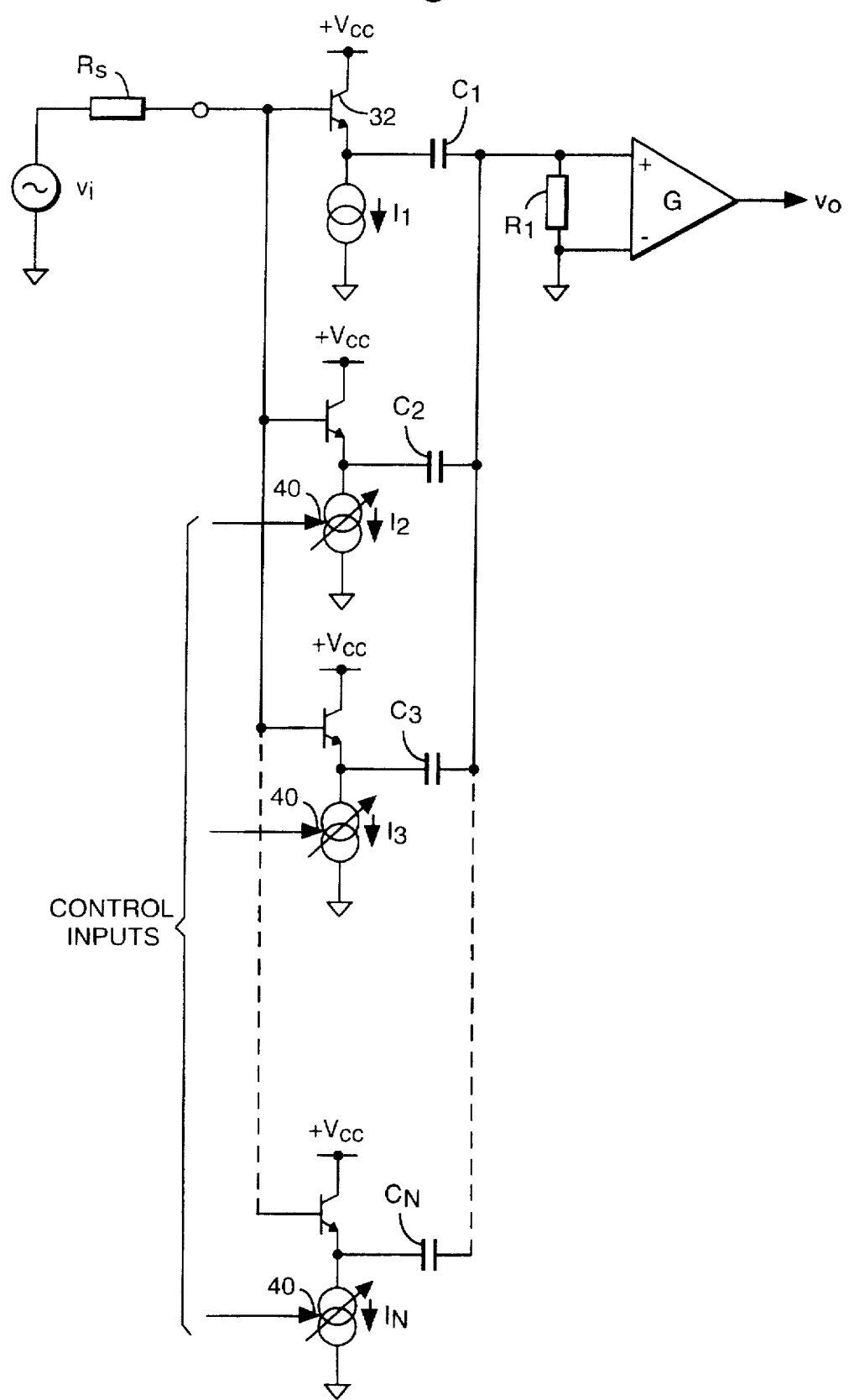
FIG. 5 is a circuit diagram of a second embodiment of the controllable filter arrangement according to the invention.

Clearly, the arrangement of FIG. 6 can also be used in conjunction with the multiple-transistor arrangement of FIG. 5, in which case there are as many resistors as there are transistors.

It is also possible to dispense with transistor 32 in the various embodiments of the invention, so long as, in the case of FIGS. 3 and 5, $C_1$ is connected to the signal source 36 and the source impedance of the source 36 is very low and, in the case of FIG. 6, $R_1$ is connected directly to a signal ground, preferably $V_{REF}$.

It is possible to employ JFET's or MOSFET's instead of bipolar transistors where the current sources are switched between a suitable finite value of current on the one hand, and zero current on the other. Although there is not the same relationship between voltage-follower output resistance and current-source current in this case as there is with bipolar transistors, nevertheless when the DC output current of a source-follower is zero, the follower is effectively biased OFF so that it cannot pass on the signal on its gate anyway. In this respect, therefore, a binary mode of frequency control can also be achieved using a source-follower, the follower and its associated current source acting as a kind of ON/OFF switch, whereby the filter component to which the follower is connected is switched either into or out of circuit.

Instead of the current source 35, or further such current sources in the arrangement of FIG. 5, being controlled in a binary fashion, it can be continuously varied by the control voltage so that any value of current can be obtained from the current source between two limits, with consequently any value of cut-off frequency being obtainable, likewise between limits. When used in this mode, bipolar transistors should be employed as the voltage-followers in view of the above-mentioned well-defined relationship between $r_e$ and source current.

Another possible mode of operation is to arrange for the current source 35 in the arrangement of FIG. 3 to be controlled by a digital control word operating through an analogue-digital converter, such that any of a number of discrete values of current, and hence of cut-off frequency, can be obtained. Again, bipolar transistors are the preferred form of voltage-follower in this mode of operation.

We claim:

1. A controllable cut-off frequency filter arrangement having an input terminal, an output terminal, and a filter network including first and second capacitors coupled to the output terminal and first and second circuit means for connecting said first and second capacitors respectively to said input terminal, each of said first and second circuit means comprising:

a transistor having emitter, base and collector electrodes;

said base electrode of said transistor being coupled to said input terminal;

said collector electrode of said transistor being coupled to a first supply terminal; and said emitter electrode of said transistor being coupled to the respective capacitor and to a second supply terminal through a current source, the current source of at least one of said first and second circuit means being controllable.

2. The filter arrangement in accordance with claim 1, wherein the current source of both said first and second circuit means is controllable.

3. The filter arrangement in accordance with claim 1, and further comprising at least one further capacitor and respective further circuit means for connecting said at least one further capacitor to said input terminal.

4. The filter arrangement in accordance with claim 1, wherein said controllable current source selectively provides a unidirectional current of a predetermined value.

5. A controllable cut-off frequency filter arrangement having an input terminal, an output terminal, and a filter network including first and second resistors coupled to the output terminal and first and second circuit means for connecting said first and second resistors respectively to said input terminal, each of said first and second circuit means comprising:

a transistor having emitter, base and collector electrodes;

said base electrode of said transistor being coupled to a reference voltage source;

said collector electrode of said transistor being coupled to a first supply terminal; and said emitter electrode of said transistor being coupled to the respective resistor and to a second supply terminal through a current source, the current source of at least one of said first and second circuit means being controllable.

* * * * *